United States Patent
Hsu et al.

(10) Patent No.: US 8,008,854 B2
(45) Date of Patent: Aug. 30, 2011

(54) LIGHT EMITTING MATERIAL AND LIGHT EMITTING DIODE DEVICE

(75) Inventors: Chain-Shu Hsu, Hsinchu (TW); Chih-Nan Lo, Taoyuan County (TW); Chi-Neng Mo, Taoyuan County (TW); Chien-Lung Tsou, Taoyuan County (TW); Jan-Tian Lian, Keelung (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 318 days.

(21) Appl. No.: 12/340,773

(22) Filed: Dec. 22, 2008

(65) Prior Publication Data

US 2010/0060146 A1    Mar. 11, 2010

(30) Foreign Application Priority Data

Sep. 8, 2008   (TW) .............................. 97134456 A

(51) Int. Cl.
  *H01J 1/63* (2006.01)
  *C08G 61/10* (2006.01)

(52) U.S. Cl. ......... 313/504; 528/396; 528/219; 528/377

(58) Field of Classification Search .................. 428/690, 428/917, 411.1, 336; 313/502–509; 528/396, 528/219, 377; 527/377; 257/40, 88, 104, 257/E51; 532/1

See application file for complete search history.

(56) References Cited

U.S. PATENT DOCUMENTS

| | | | |
|---|---|---|---|
| 4,952,334 A | 8/1990 | Hakemi et al. | |
| 5,087,672 A | 2/1992 | Babirad et al. | |
| 5,453,855 A | 9/1995 | Nakamura et al. | |
| 5,662,828 A | 9/1997 | Tsubata et al. | |
| 5,730,898 A | 3/1998 | Jin et al. | |
| 5,968,414 A | 10/1999 | Min et al. | |
| 6,184,322 B1 | 2/2001 | Styring et al. | |
| 7,220,040 B2 | 5/2007 | Lengyel et al. | |
| 7,284,874 B2 | 10/2007 | Jeong et al. | |
| 7,286,863 B2 | 10/2007 | Leonhardt et al. | |
| 7,371,403 B2 | 5/2008 | McCarthy et al. | |
| 2003/0039838 A1* | 2/2003 | Chen et al. .................. | 428/411.1 |
| 2003/0154647 A1* | 8/2003 | Nguyen et al. .................. | 44/329 |
| 2005/0123795 A1* | 6/2005 | Lussier et al. ................. | 428/690 |

* cited by examiner

*Primary Examiner* — Angela Ortiz
*Assistant Examiner* — J. L. Yang
(74) *Attorney, Agent, or Firm* — Jianq Chyun IP Office

(57) ABSTRACT

A light emitting material includes a polyfluorene derivative having a liquid crystal side group is provided. The polyfluorene derivative has a chemical structure as described in structure 1:

structure 1 formula 1

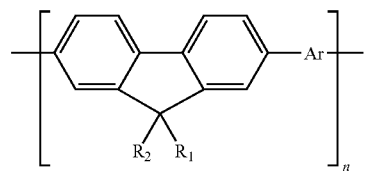

wherein Ar is an aromatic ring containing the liquid crystal side group, $R_1$ and $R_2$ are alkanes and n is 20 to 500.

9 Claims, 1 Drawing Sheet

LIGHT EMITTING MATERIAL AND LIGHT EMITTING DIODE DEVICE

CROSS-REFERENCE TO RELATED APPLICATION

This application claims the priority benefit of Taiwan application serial no. 97134456, filed on Sep. 8, 2008. The entirety of the above-mentioned patent application is hereby incorporated by reference herein and made a part of specification.

BACKGROUND OF THE INVENTION

1. Field of the Invention

The present invention generally relates to a light emitting material and a light emitting diode device, in particular, to a light emitting material capable of emitting polarized light and a light emitting diode (LED) device manufactured using the same.

2. Description of Related Art

A light emitting diode (LED) is a semiconductor device that is mainly made of a semiconductor material of III-V group of elements compound. Such a semiconductor material is capable of convert electric energy into light. In specific, when a current is applied to such a semiconductor material, electrons within the semiconductor material combine with holes, and excess energy is released as light, thereby achieving the light emitting effect.

Since the light emitting phenomenon of the LED belongs to cold luminescence rather than thermo luminescence or discharge luminescence, the lifespan of the LED may be up to about 100,000 hours, and no idling time is required. In addition, due to such advantages of quick response time, small volume, low power consumption, low pollution (mercury free), high reliability and suitable for mass production, the LED can be applied in a wide variety of fields, such as scanner light sources requiring for a fast response, back lights of liquid crystal displays (LCDs), illumination for instrument panels of vehicles, traffic signal lamps, and ordinary illuminators.

For back lights of LCDs, the LCDs need to use polarized light as the display light source. Although the advantages of the LED such as small volume, low power consumption and capable of mass production enable the LCDs to be considerably convenient and competitive, all light sources available on the market, including the LED, are suitable for emitting non-polarized light. Therefore, when designing an LCD, a polarizing plate has to be disposed between the back light and an LCD panel. In such a manner, the volume and fabricating cost of the LCDs cannot be further reduced.

SUMMARY OF THE INVENTION

Accordingly, the present invention is directed to a light emitting material, so as to solve the problem that the light emitted by ordinary light emitting materials is not polarized.

The present invention is also directed to a light emitting diode (LED) device, so as to emit polarized light.

The present invention provides a light emitting material, which includes a polyfluorene derivative having an aromatic ring containing a liquid crystal side group. The polyfluorene derivative has a chemical structure of formula 1:

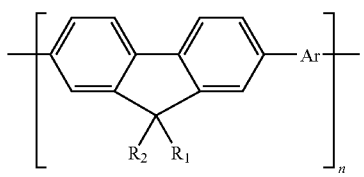

formula 1

Ar is the aromatic ring containing the liquid crystal side group, $R_1$ and $R_2$ are alkyls, and n is 20 to 500.

In an embodiment of the present invention, the liquid crystal side group is, for example, a chain of five benzene rings. For example, the chain of five benzene rings has a chemical structure of formula 2:

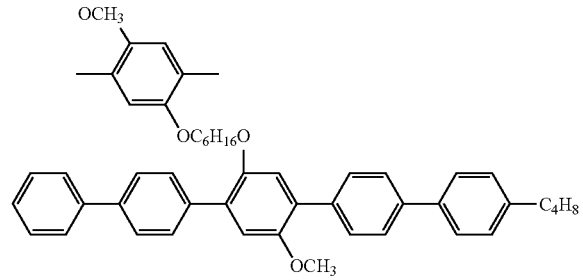

formula 2

In an embodiment of the present invention, the light emitting material further includes a plurality of chromophores bonded to the polyfluorene derivative. The chromophores have a chemical structure of at least one of formula 3 and formula 4:

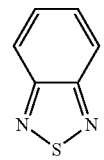

formula 3

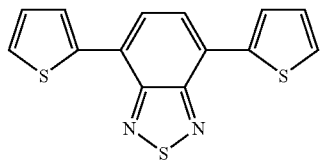

formula 4

The present invention also provides an LED device, which includes a substrate, a first electrode, a conductive alignment layer, a light emitting material layer, and a second electrode. The first electrode is disposed on the substrate, and the conductive alignment layer is disposed on the first electrode. The light emitting material layer is disposed on the conductive alignment layer. The light emitting material layer includes a polyfluorene derivative having an aromatic ring containing a liquid crystal side group. The polyfluorene derivative has a chemical structure of formula 1:

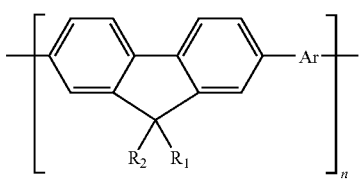

formula 1

Ar is the aromatic ring containing the liquid crystal side group, $R_1$ and $R_2$ are alkyls, and n is 20 to 500. The second electrode is disposed on the light emitting material layer.

In an embodiment of the present invention, one of the first electrode and the second electrode is, for example, a transparent electrode. Meanwhile, the other of the first electrode and the second electrode is, for example, a metal electrode.

In an embodiment of the present invention, the conductive alignment layer is made of poly (3,4-ethylenedioxythiophene) (PEDOT).

In an embodiment of the present invention, the liquid crystal side group is a chain of five benzene rings. For example, the chain of five benzene rings has a chemical structure of formula 2:

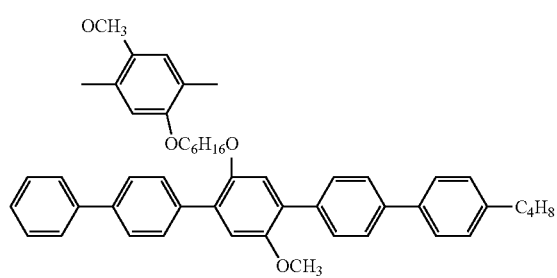

formula 2

In an embodiment of the present invention, the LED device further includes a plurality of chromophores bonded to the polyfluorene derivative. The chromophores have a chemical structure of at least one of formula 3 and formula 4:

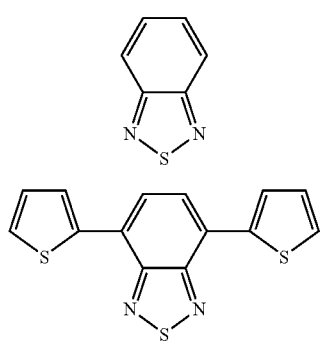

formula 3 formula 4

In the present invention, a structure of liquid crystal side group is bonded in the light emitting material, so the light emitted by the light emitting material may be influenced by optical properties of the liquid crystal material. In the LED device of the present invention, the light emitting material having the liquid crystal side group is formed on a conductive alignment layer and thus has a particular orientation, so the LED device can emit polarized light. Moreover, through addition of chromophores, the light emitting material of the present invention can present light of different colors so as to improve its convenience of use.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
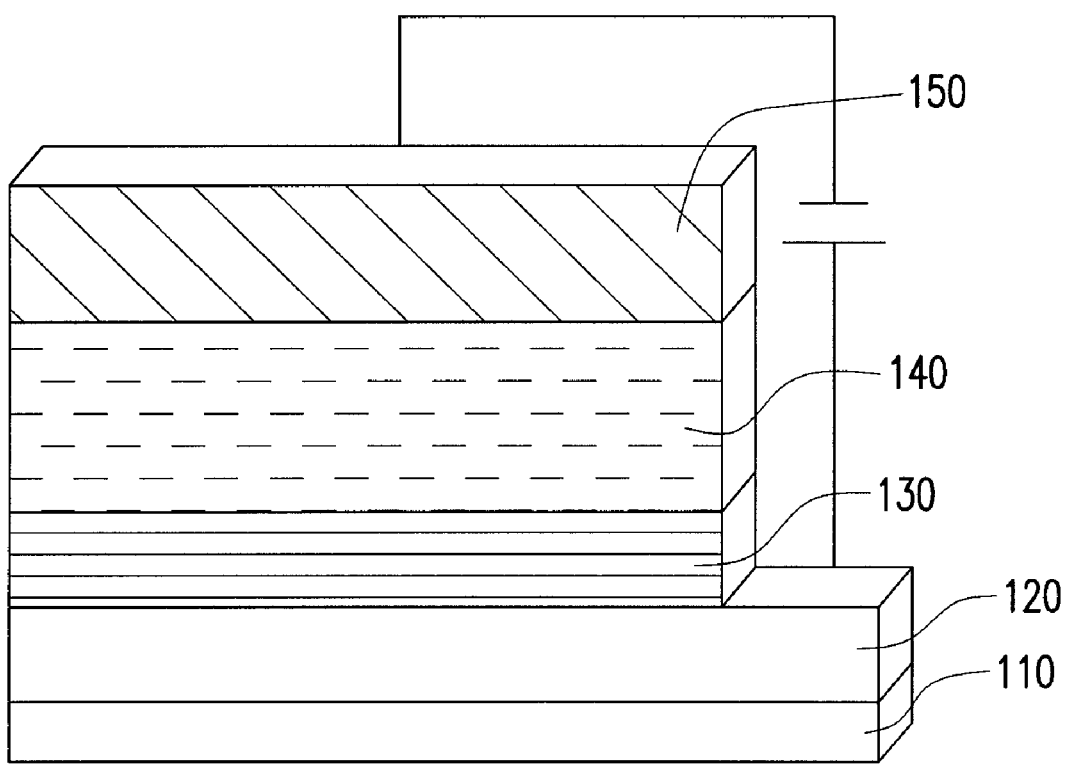
FIG. 1 shows a light emitting diode device according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Since ordinary light sources cannot provide polarized light, an LCD has to be disposed with a corresponding polarizing plate between a back light module and an LCD panel. Thus, the design requirements of reducing the volume cannot be met genuinely. Therefore, the present invention provides a light emitting material having a liquid crystal side group, which utilizes the orientation and optical properties of the liquid crystal material to enable the light emitting material to emit light of a particular polarity under proper arrangement conditions. By applying such a light emitting material to an LED device, an LED device capable of emitting polarized light can be provided and the device design of the LCDs can further be simplified.

In an embodiment of the present invention, the light emitting material includes, for example, a polyfluorene derivative having an aromatic ring containing a liquid crystal side group. The polyfluorene derivative has a chemical structure of formula 1:

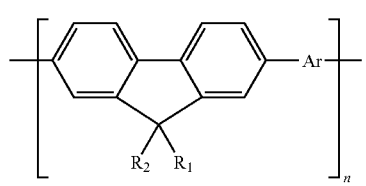

formula 1

Ar is the aromatic ring containing the liquid crystal side group, $R_1$ and $R_2$ are alkyls, and n is 20 to 500. In practice, in an embodiment, $R_1$ and $R_2$ may be $C_8H_{17}$.

In this embodiment, the polyfluorene derivative is, for example, formed by polymerization reaction of a first fluorene, a second fluorene, and a liquid crystal group. In particular, the first fluorene and the second fluorene respectively have chemical structures of formula 1-a and formula 1-b:

formula 1-a

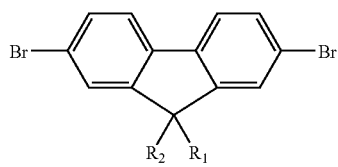

formula 1-b

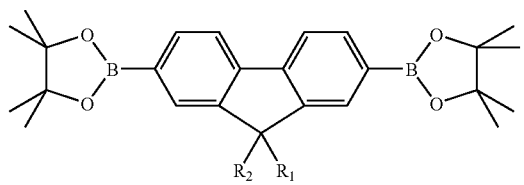

That is, the first fluorene is, for example, a fluorene with a bromine atom, and the second fluorene is a fluorene with a boron atom. In addition, in this embodiment, the liquid crystal group may be a chain of five benzene rings. The chain of five benzene rings has, for example, a chemical structure of formula 1-c:

formula 1-c

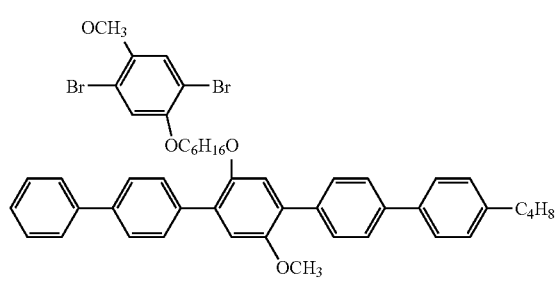

When the first fluorene, the second fluorene, and the liquid crystal group undergo the polymerization reaction, the two fluorenes are bonded to each other through reacton between the borate ester of the second fluorene and the bromine of the first fluorene. Meanwhile, the liquid crystal group is bonded to the second fluorene through reaction between the boron of the second fluorene and the bromine of the liquid crystal group. Through such a polymerization reaction, the above chemical structure of formula 1, i.e., the light emitting material of this embodiment is generated. Herein, the chain of five benzene rings is bonded to the polyfluorene as a side chain.

In the light emitting material of this embodiemnt, Ar of formula 1 is, for example, the liquid crystal group bonded to the polyfluorene derivative through polymerization. In practice, the liquid crystal side group has been bonded into the polyfluorene derivative through reaction between the bromine atom of the original liquid crystal group and the boron atom of the second fluorene. Therefore, Ar has, for example, a chemical structure of formula 2:

formula 2

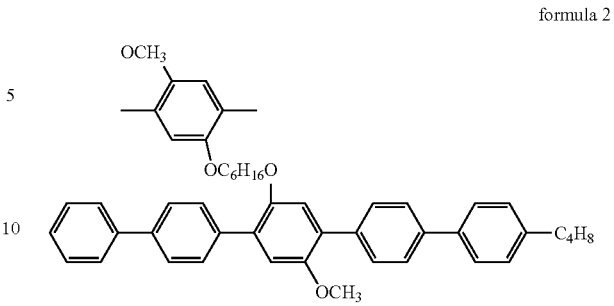

When fabricating the light emitting material of this embodiemnt, both the first fluorene and the liquid crystal group need to react with and be bonded to the second fluorene. In practice, the weight percentage (wt %) of the second fluorene is, for example, 50%, and the total wt % of the first fluorene and the liquid crystal group is, for example, 50%. For example, in an embodiment, the wt % of the first fluorene and that of the liquid crystal group may be respectively 40% and 10%, 30% and 20%, or 10% and 40%. It should be understood that these content ratios are merely given by way of example, and are not intended to limit the present invention. In addition, the light emitting material of this embodiemnt is synthesized by, for example, the Suzuki coupling method.

It should be noted that, the liquid crystal side group can enable the light emitting material of this embodiment to have properties of liquid crystal molecules. Therefore, the light emitting material of this embodiemnt can substantially have properties such as orientation and particular polarity. It should be understood that the formulae of the above materials are merely given by way of example, and are not intended to limit the present invention. It should be known to those of ordinary skill in the art that any liquid crystal group that can react with and be bonded to the polyfluorene derivative is applicable to the present invention.

In general, the light emitted by fluorene is blue. Therefore, in other embodiments, when fabricating the light emitting material, different chromophores can be added such that the chromophores are bonded to the polyfluorene derivative, in order to enable the light emitting material of this embodiemnt to emit light of other colors. For example, the chromophores may have a chemical structure of at least one of formula 3 and formula 4:

formula 3

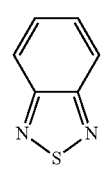

formula 4

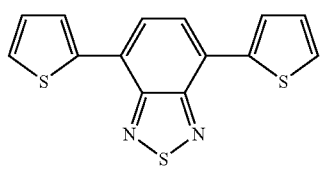

The above chromophores may, for example, react with and be bonded to the second fluorene, so as to form a light emitting material capable of emitting light of different colors. For example, the light emitting material of this embodiemnt is synthesized by the Suzuki coupling method, with content ratios of the materials as shown in the table below.

| Material | First Fluorene | Second Fluorene | Chromophore of Formula 3 | Chromophore of Formula 4 | Liquid Crystal Group |
|---|---|---|---|---|---|
| Light Emitting Material A | 15% | 50% | 15% | 0% | 20% |
| Light Emitting Material B | 15% | 50% | 10% | 5% | 20% |

The light emitting material A can, for example, emit green light, while the light emitting material B can, for example, emit red light. However, the present invention is not limited to the chromophores of formula 3 and formula 4, and any material that can provide color adjustment and can be polymerized with the second fluorene is capable to be used as the chromophore of the present invention.

The average molecular weight of the light emitting materials provided in the present invention is about 10,000 to 100,000, and the high molecular diffusivity is about 1.10 to 2.00. Since the light emitting materials of this kind can possess a good film-forming property, the light emitting materials of the present invention can be formed in a device by a spin-coating method. That is, the light emitting materials of the present invention is apt to simplify the device fabricating process, as compared to an ordinary light emitting material having a low molecular weight that must be formed in a device by vacuum evaporation. Moreover, it is found from the experimental results that the fluorescence polarization ratios of the light emitting materials of the present invention are all greater than 10. In other words, the light emitting materials of the present invention have a fairly good polarization property and can thus provide polarized light.

FIG. 1 shows an LED device according to an embodiment of the present invention. Referring to FIG. 1, an LED device 100 includes a substrate 110, a first electrode 120, a conductive alignment layer 130, a light emitting material layer 140, and a second electrode 150. The first electrode 120 is disposed on the substrate 110, and the conductive alignment layer 130 is disposed on the first electrode 120. The light emitting material layer 140 is disposed on the conductive alignment layer 130, and the second electrode 150 is disposed on the light emitting material layer 140. In this embodiment, the light emitting material layer 140 is made of any one or more selected from the group consisting of the light emitting materials of the above embodiments. In other words, the light emitting material that the light emitting material layer is made of is substantially a polyfluorene derivative having a liquid crystal side group. Moreover, through selection and combination of the light emitting materials, the LED device 100 can emit light of various different colors.

Since the polyfluorene derivative of this embodiemnt has properties of liquid crystal molecules, the conductive alignment layer 130 may, for example, have an alignment structure suitable for orientation of the light emitting material. In such a manner, upon the light emitting material is solidified into the light emitting material layer 140, the LED device 100 can provide polarized light having a particular polarization character. If such an LED device 100 is applied to an apparatus such as an LCD that requires for particular polarized light to serve as a light source, it helps to simplify the device design. For example, if an LCD uses the LED device 100 of this embodiemnt as a light source, the LCD can utilize the light source having a polarity to display without additonally disposing a lower polarizing plate.

In this embodiment, the conductive alignment layer 140 is made of, for example, PEDOT. One of the first electrode 130 and the second electrode 150 is, for example, a transparent electrode, and the other of the first electrode 130 and the second electrode 150 is, for example, a metal electrode. When the LED device 100 emits light, the light is, for example, diverged outward from one side of the transparent electrode. In other words, this embodiment is not intended to limit whether the LED device 100 emits the light from the first electrode 130 to the substrate 110 or emits the light from the second electrode 150 to a direction away from the substrate 110.

In practice, the LED device 100 is, for example, fabricated by the following steps. First, the first electrode 120 is formed on the substrate 110. The first electrode may be made of a transparent conductive material or a metal, and in this embodiment, the transparent conductive material is taken as an example. Next, the conductive alignment layer 130 is formed on the first electrode 120. Meanwhile, a rubbing process is performed so as to form a suitable alignment structure in the conductive alignment layer 130. Afterward, one or a combination of the above light emitting materials is formed on the conductive alignment layer 130 by a spin-coating method. Accordingly, the light emitting material is solidified into the light emitting material layer 140. It should be noted that, since the conductive alignment layer 130 has a particular alignment structure and the light emitting material has the orientation of liquid crystal molecules, the light emitting material is solidified into the light emitting material layer 140 in a particular orientation manner. Then, the second electrode 150 is formed on the light emitting material layer 140, so as to complete the LED device 100 of this embodiment. In this embodiment, the first electrode 120 is a transparent electrode, and the second electrode 150 may substantially be made of a metal. It should be understood that, if the first electrode 120 is a metal electrode, the second electrode 150 may be a transparent electrode.

In such a process, since the light emitting material is solidified into the light emitting material layer 140 in a particular orientation manner, the light emitted by the LED device 100 is influenced by optical properties of the liquid crystal side group and thus presents a particular polarization character. That is, the LED device 100 of this embodiment can provide polarized light without cooperating with additional polarizing apparatuses. Therefore, the LED device 100 can solve the problem in the prior art that the volume of the device cannot be reduced since the light source needs to cooperate with a polarizing apparatus in order to provide polarized light. In addition, since the light emitting material provided in the present invention has a good film-forming property, the light emitting material layer 140 may be formed by a simple spin-coating method when fabricating the LED device 100, which is conducive to simplify the process equipments and reduce the process cost.

To sum up, since the present invention enables the light emitting material to have a liquid crystal side group, the light emitting material has the properties of liquid crystal molecules such as orientation and polarity. When the light emitting material of the present invention is applied to an LED device, the LED device can emit polarized light. In such a manner, the LED device of the present invention can provide polarized light without cooperating with additional polarizing apparatuses, thereby being apt to improve the practicability of the LED device. Moreover, the light emitting material of the present invention helps to simplify the manufacturing of the device due to its good film-forming property.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting material, comprising a polyfluorene derivative having a liquid crystal side group, wherein the polyfluorene derivative has a chemical structure of formula 1:

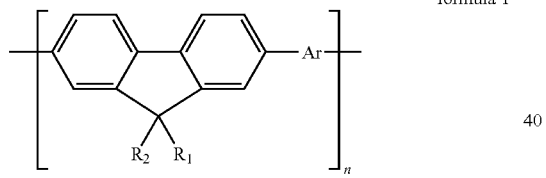

formula 1 wherein Ar is an aromatic ring containing the liquid crystal side group, $R_1$ and $R_2$ are alkyls, and n is 20 to 500, wherein the liquid crystal side group is a chain of five benzene rings and the chain of five benzene rings has a chemical structure of formula 2:

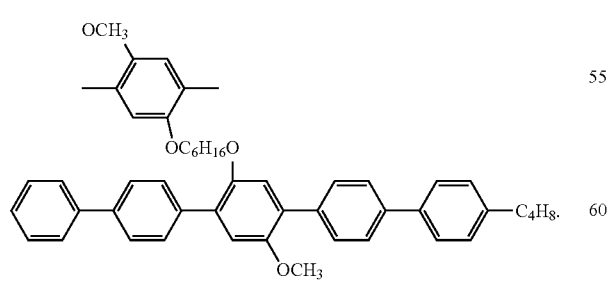

formula 2

2. The light emitting material according to claim 1, further comprising a plurality of chromophores bonded to the polyfluorene derivative.

3. The light emitting material according to claim 2, wherein the chromophores have a chemical structure of at least one of formula 3 and formula 4:

formula 3

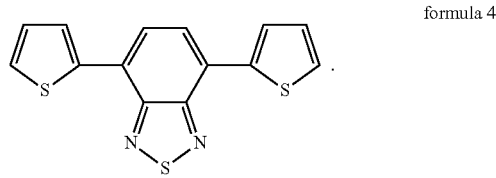

formula 4

4. A light emitting diode (LED) device, comprising:
a substrate;
a first electrode, disposed on the substrate;
a conductive alignment layer, disposed on the first electrode;
a light emitting material layer, disposed on the conductive alignment layer, wherein the light emitting material layer comprises a polyfluorene derivative having a liquid crystal side group, and the polyfluorene derivative has a chemical structure of formula 1:

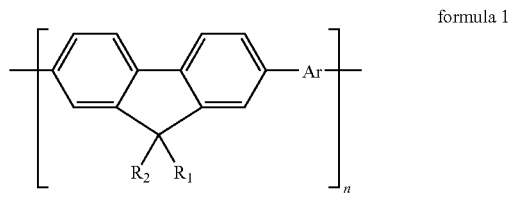

formula 1 wherein Ar is an aromatic ring containing the liquid crystal side group, $R_1$ and $R_2$ are alkyls, and n is 20 to 500, wherein the liquid crystal side group is a chain of five benzene rings and the chain of five benzene rings has a chemical structure of formula 2:

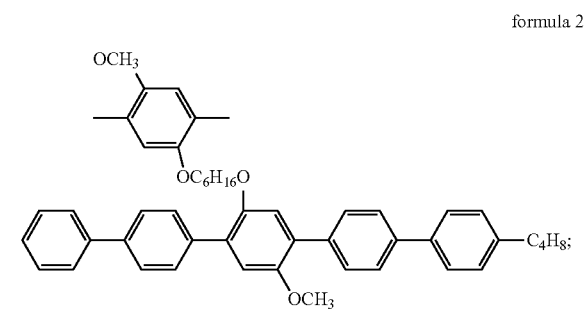

formula 2 and
a second electrode, disposed on the light emitting material layer.

5. The LED device according to claim 4, wherein one of the first electrode and the second electrode is a transparent electrode.

6. The LED device according to claim 5, wherein the other of the first electrode and the second electrode is a metal electrode.

7. The LED device according to claim 4, wherein the conductive alignment layer is made of PEDOT (Poly(3,4-ethylenedioxythiophene)).

8. The LED device according to claim 4, further comprising a plurality of chromophores bonded to the polyfluorene derivative.

9. The LED device according to claim 8, wherein the chromophores have a chemical structure of at least one of formula 3 and formula 4:

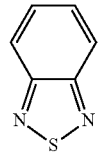

formula 3

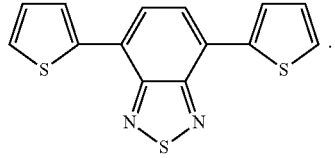

formula 4

* * * * *